United States Patent [19]
Oishi et al.

[11] Patent Number: 6,004,405
[45] Date of Patent: Dec. 21, 1999

[54] WAFER HAVING A LASER MARK ON CHAMFERED EDGE

[75] Inventors: Hiroshi Oishi; Keiichiro Asakawa, both of Annaka, Japan

[73] Assignee: Super Silicon Crystal Research Institute Corp., Japan

[21] Appl. No.: 09/036,875

[22] Filed: Mar. 9, 1998

[30] Foreign Application Priority Data

Mar. 11, 1997 [JP] Japan .................................. 9-055994

[51] Int. Cl.⁶ .................................................. H01L 21/76
[52] U.S. Cl. ..................... 148/33.2; 257/620.2; 414/936; 438/959; 438/401; 438/462
[58] Field of Search ................ 148/33.2, 33; 211/41.18; 257/620.2; 414/936; 438/959, 401, 462; 428/192, 131, 212, 156; 283/81

[56] References Cited

U.S. PATENT DOCUMENTS

| | | | |
|---|---|---|---|
| 4,418,467 | 12/1983 | Iwai | 29/574 |
| 5,800,906 | 9/1998 | Lee et al. | 428/192 |
| 5,876,819 | 3/1999 | Kimura et al. | 428/64.1 |

*Primary Examiner*—Charles Bowers
*Assistant Examiner*—Craig Thompson
*Attorney, Agent, or Firm*—Webb Ziesenheim Logsdon Orkin & Hanson, P.C.

[57] ABSTRACT

A wafer 1 has a chamfered edge 2 polished to specular glossiness, and a laser mark for indication of crystal orientation is put on the chamfered edge 2. Another laser mark 4 for indication of specification, production number, identification, etc. may be carved as a bar code on the chamfered edge 2. These marks 3, 4 are carved on the chamfered edge 2 by laser marking which does not put any harmful influences on the wafer 1.

4 Claims, 1 Drawing Sheet

WAFER HAVING A LASER MARK ON CHAMFERED EDGE

BACKGROUND OF THE INVENTION

The present invention relates to a wafer having a laser mark for indication of a crystal orientation, specification, etc.

A wafer sliced off an ingot is processed in various steps such as lapping, chamfering and etching. In these steps, a mark for indication of a crystal orientation is carved on an edge of the wafer. The mark is used for setting the wafer, when the wafer is scribed along a cleavage plane for instance.

Such a mark has been put on a wafer by various methods.

The method is the most popular one by which an orientation flat is formed at an edge of a wafer. The orientation flat is used for a crystal orientation of the wafer in later steps. However, it is difficult to precisely align a wafer using the orientation, since the orientation flat is formed in a relatively broad area crossing an edge of the wafer at an obtuse angle. The orientation flat also reduces an effective area of the wafer. Besides, the orientation flat puts restrictions on a shape of an electrostatic chuck which is used for handling a wafer and causes a harmful effect on dynamic balance during spin rotation of a wafer.

A notch engraved on an edge of a wafer is also used as a mark or indication of a crystal orientation. In this case, a notched edge is polished to specular glossiness, so as to distinctly detect the notched part during measuring in later steps. Such polishing is troublesome, and residual stresses inevitably remain near the notched part. It is difficult to completely remove such residual stresses.

A laser mark useful an indication of a crystal orientation has been recently proposed. The laser mark is put on a front or back side of a wafer by partially melting a surface layer of the wafer with irradiation of a laser beam. The laser mark can be easily carved on the front or back side of the wafer without introduction of any mechanical stresses. However, the laser mark reduces an effective area of a wafer, and inevitably requires a troublesome process for rectifying data so as to eliminate errors caused by the marked part during measuring a shape of the wafer.

SUMMARY OF THE INVENTION

The present invention aims at provision of a wafer whose crystal orientation, specification, etc. are easily read out without harmful effects such as residual work stress or thermal stress on a wafer.

A wafer according to the present invention has a chamfered edge polished to specular glossiness and a laser mark for indication of a crystal orientation on the chamfered edge. Another laser mark for indication of specification, wafer identification, a lot number, etc. may be put as a bar code on the chamfered edge in addition to the laser mark for indication of a crystal orientation.

PREFERRED EMBODIMENT OF THE INVENTION

Figure 1A:
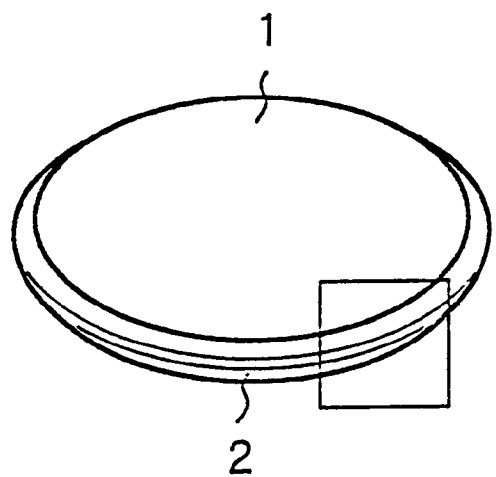
FIG. 1 is a perspective view together with a partially enlarged view illustrating a wafer having a chamfered edge on which a mark for indication of a crystal orientation and a mark for identification of the wafer are put on by laser marking.

A wafer 1 has a chamfered edge 2 polished to specular glossiness. A mark 3 for indication of a crystal orientation and optionally a mark 4 for identification of a wafer are put on the chamfered edge 2. The marks 3, 4 can be carved 200–500 $\mu$m in depth on the chamfered edge 2 by hard or soft laser marking. When a bar code is put on as the mark 4, each fine line is preferably controlled within a range of 10–100 $\mu$m in width.

Hard laser marking using a high-power energy beam may be used to put the marks 3, 4 on the edge 2 after being chamfered, and then the marked edge 2 is polished to specular glossiness. In this case, the marks 3, 4 remain on the polished edge 2 to a depth above approximately 10 $\mu$m. Soft laser marking using a low-power energy beam may be used to put the marks 3, 4 on the polished edge 2. In this case, the marks 3, 4 remain on the edge 2 to a depth below approximately 3 $\mu$m.

When a bar code is applied as the mark 4, various information, e.g. identification, grade, operation number and user data, necessary for hysteresis management of a wafer can be written on the chamfered edge 2. The mark 4 for identification of a wafer is preferably put on the chamfered edge 2 at a position spaced about 2–10 mm from the mark 3 for indication of a crystal orientation, so as to distinguish the mark 4 from the mark 3.

Since the chamfered edge 2 is removed from the wafer 1 when the wafer 1 is divided into tips, an effective area of the wafer 1 is not reduced by the marking. The laser marking for carving the marks 3, 4 on the chamfered edge 2 does not put any harmful influences on the wafer, since it inputs only a very small heat to the wafer 1.

When a shape of the wafer 1 is measured using a capacitive sensing method or an optical sensor, errors caused by ruggedness at the marked parts are not included in measurement data, since the laser marks 3, 4 are not present on a front or back side of the wafer 1. Consequently, the obtained data is useful for accurately determining the shape of the wafer 1 without the necessity of troublesome processes for eliminating the effects caused by the marks 3, 4.

The marks 3, 4 put on the chamfered edge 2 can be read by naked eyes or an optical reader available on the market. Data represented by the marks 3, 4 can be distinctly and accurately read out, since the chamfered edge 2 on which the marks 3, 4 are put is polished to specular glossiness. In measurement of a shape of the wafer 1, errors caused by ruggedness at the marked parts are excluded from measurement data so as to enable omission of troublesome processes for eliminating effects caused by the marked parts.

The readout data are used for various purposes such as quality control of a wafer, production control, shipment, receipt or processing in the following device-making step.

Thus, necessary data can be written on the wafer by laser marking, without any harmful influences on the front and back sides of the wafer.

A wafer according to the present invention as aforementioned has a chamfered edge polished to specular glossiness, a mark for indication of a crystal orientation and optionally a mark for identification of the wafer are put on the edge. Since the chamfered edge is removed when the wafer is divided into tips, an effective area of the wafer is not reduced at all. In the case of measuring a shape of the wafer, it is possible to omit troublesome processes for eliminating defects caused by marked parts from a measurement result. In addition, the marks are put on the chamfered edge of the wafer without such harmful influences as residual work stress or thermal stress which are inevitable in a conventional OF method or notch method. Consequently, the marked wafer keeps excellent crystallographic properties and is improved in handling and operatability.

What is claimed is:

1. A wafer, comprising a chamfered edge polished to specular glossiness and a laser mark for indication of a crystal orientation located on the chamfered edge.

2. A wafer, comprising a chamfered edge polished to specular glossiness and on which a laser mark for indication of a crystal orientation and another laser mark for indication of identification are located.

3. The wafer defined in claim 2, wherein the laser mark for indication of identification is spaced from the laser mark for indication of a crystal orientation.

4. A method of marking a wafer, comprising:
    chamfering an edge of the wafer;
    laser marking at least one mark on the chamfered edge; and
    polishing the laser marked edge to specular glossiness.

* * * * *

UNITED STATES PATENT AND TRADEMARK OFFICE
CERTIFICATE OF CORRECTION

PATENT NO. : 6,004,405
DATED : December 21, 1999
INVENTOR(S) : Hiroshi Oishi et al.

It is certified that error appears in the above-identified patent and that said Letters Patent is hereby corrected as shown below:

Column 1 Line 15 "The method" should read --The OF method--.

Column 1 Line 34 "useful an" should read --useful as an--.

Figure 1B:
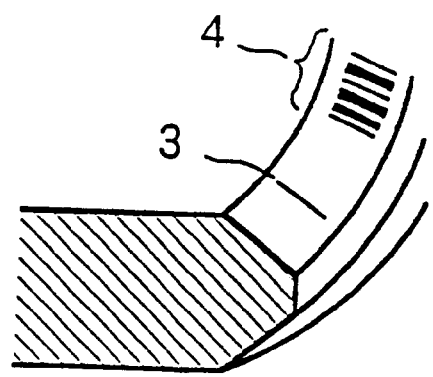

Column 1 Line 58 "FIG. 1 is" should read --FIGS. 1a and 1b, respectively, are--.

Column 1 Line 58 after "view" delete "together" and insert --and--.

Signed and Sealed this

Twelfth Day of September, 2000

Attest:

Q. TODD DICKINSON

*Attesting Officer*    *Director of Patents and Trademarks*